United States Patent
Brandl

(10) Patent No.: US 11,809,743 B2
(45) Date of Patent: Nov. 7, 2023

(54) REFRESH MANAGEMENT LIST FOR DRAM

(71) Applicant: Advanced Micro Devices, Inc., Santa Clara, CA (US)

(72) Inventor: Kevin M. Brandl, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/027,375

(22) Filed: Sep. 21, 2020

(65) Prior Publication Data

US 2022/0091784 A1 Mar. 24, 2022

(51) Int. Cl.
*G06F 3/06* (2006.01)

(52) U.S. Cl.
CPC .......... *G06F 3/0659* (2013.01); *G06F 3/0613* (2013.01); *G06F 3/0652* (2013.01); *G06F 3/0673* (2013.01)

(58) Field of Classification Search
CPC .... G06F 3/0659; G06F 3/0613; G06F 3/0652; G06F 3/0673
See application file for complete search history.

(56) References Cited

U.S. PATENT DOCUMENTS

| | | | |
|---|---|---|---|
| 9,293,188 B2 | 3/2016 | Brandl | |
| 9,576,637 B1* | 2/2017 | Balakrishnan | .... G11C 11/40615 |
| 10,790,005 B1* | 9/2020 | He | ........................... G11C 7/24 |
| 10,885,966 B1* | 1/2021 | Devaux | ............. G11C 11/40611 |
| 2013/0055046 A1 | 2/2013 | Blodgett | |
| 2014/0085995 A1* | 3/2014 | Greenfield | ............... G11C 7/24 365/201 |
| 2014/0269133 A1 | 9/2014 | Mccollum | |
| 2018/0203758 A1 | 7/2018 | Kannan et al. | |
| 2019/0066759 A1 | 2/2019 | Nale | |
| 2019/0066808 A1* | 2/2019 | Nale | ..................... G11C 11/406 |
| 2019/0139596 A1 | 5/2019 | Jang et al. | |
| 2020/0020384 A1* | 1/2020 | Zhao | ................. G11C 11/40618 |
| 2020/0111525 A1* | 4/2020 | Cowles | ................. G11C 11/408 |
| 2020/0135263 A1* | 4/2020 | Brown | ............. G11C 11/40622 |
| 2020/0251158 A1* | 8/2020 | Shore | .................. G11C 11/4076 |
| 2021/0012832 A1* | 1/2021 | Devaux | ............. G11C 11/40603 |
| 2021/0304813 A1* | 9/2021 | Cowles | ............. G11C 11/40611 |
| 2021/0358540 A1* | 11/2021 | Brandl | ............. G11C 11/40615 |
| 2021/0374006 A1* | 12/2021 | Wang | ................ G11C 11/40603 |
| 2022/0051716 A1* | 2/2022 | Ayyapureddi | ...... G06F 13/1636 |
| 2022/0113868 A1* | 4/2022 | Cowles | ............. G11C 11/40611 |

OTHER PUBLICATIONS

International Search Report and Written Opinion for International Application No. PCT/US2021/050932, dated Jan. 3, 2022, 7 pages.

* cited by examiner

*Primary Examiner* — Ryan Bertram
(74) *Attorney, Agent, or Firm* — Polansky & Associates, P.L.L.C.; Paul J. Polansky; Nathan H. Calvert

(57) ABSTRACT

A memory controller includes a command queue having a first input for receiving memory access requests, and a memory interface queue having an output for coupling to a memory channel adapted for connecting to at least one dynamic random access memory (DRAM) module. A refresh control circuit monitors activate commands to be sent over the memory channel. In response to an activate command meeting a designated condition, the refresh control circuit identifies a candidate aggressor row associated with the activate command. A command is sent to the DRAM requesting that the candidate aggressor row be queued for mitigation in a future refresh or refresh management event.

14 Claims, 7 Drawing Sheets

REFRESH MANAGEMENT LIST FOR DRAM

BACKGROUND

Computer systems typically use inexpensive and high-density dynamic random access memory (DRAM) chips for main memory. When a particular row in a DRAM chip is activated for reading or writing, the word line associated with the row is activated, and the contents of the memory cells along the row are read into a page buffer. Subsequent read and write accesses to memory cells in the row can take place wholly within the page buffer, without accessing the row again. When a data processor later accesses another row in the same memory bank, the memory cells along the row are restored in a precharge operation before the other row can be activated.

Modern DRAM chips typically store multiple gigabits (Gb) of data using deep sub-micron technology. Because of the high density and small feature size, rows of the memory are so physically close to other rows that the activation of a particular row can upset data stored in adjacent rows by changing the charge on the memory cell capacitors. In the past, these upsets were typically are harmless because the memory cells are refreshed periodically. However, occasionally some memory access patterns cause certain rows to be activated and precharged so many times before the next refresh cycle that the memory cells in adjacent rows become corrupted and reverse logic state. After being corrupted, the original data is lost and cannot be restored in subsequent refresh cycles. As feature sizes become smaller, this problem, known as "row hammer", becomes harder to mitigate because the number of row activates required to cause the problem becomes smaller.

One known technique to address the data upset problem is known as targeted row refresh (TRR). In order to ensure that a DRAM row is not activated too many times within a refresh period without a refresh of adjacent rows, a memory controller places the DRAM into a TRR mode by setting certain mode register bits. The controller then issues successive activate and precharge commands to rows that are physically adjacent to the potential aggressor row. Typically, TRR mode is self-clearing and is disabled automatically after completion of a defined TRR flow. TRR mode can also be exited via a Mode Register Set command at the completion of the defined TRR flow. While TRR allows the memory controller to mitigate the row hammer issue, the TRR mode is entered by setting the mode register, which requires a substantial amount of time since all banks must be in the idle state before the controller can issue a Mode Register Set command.

Figure 1:
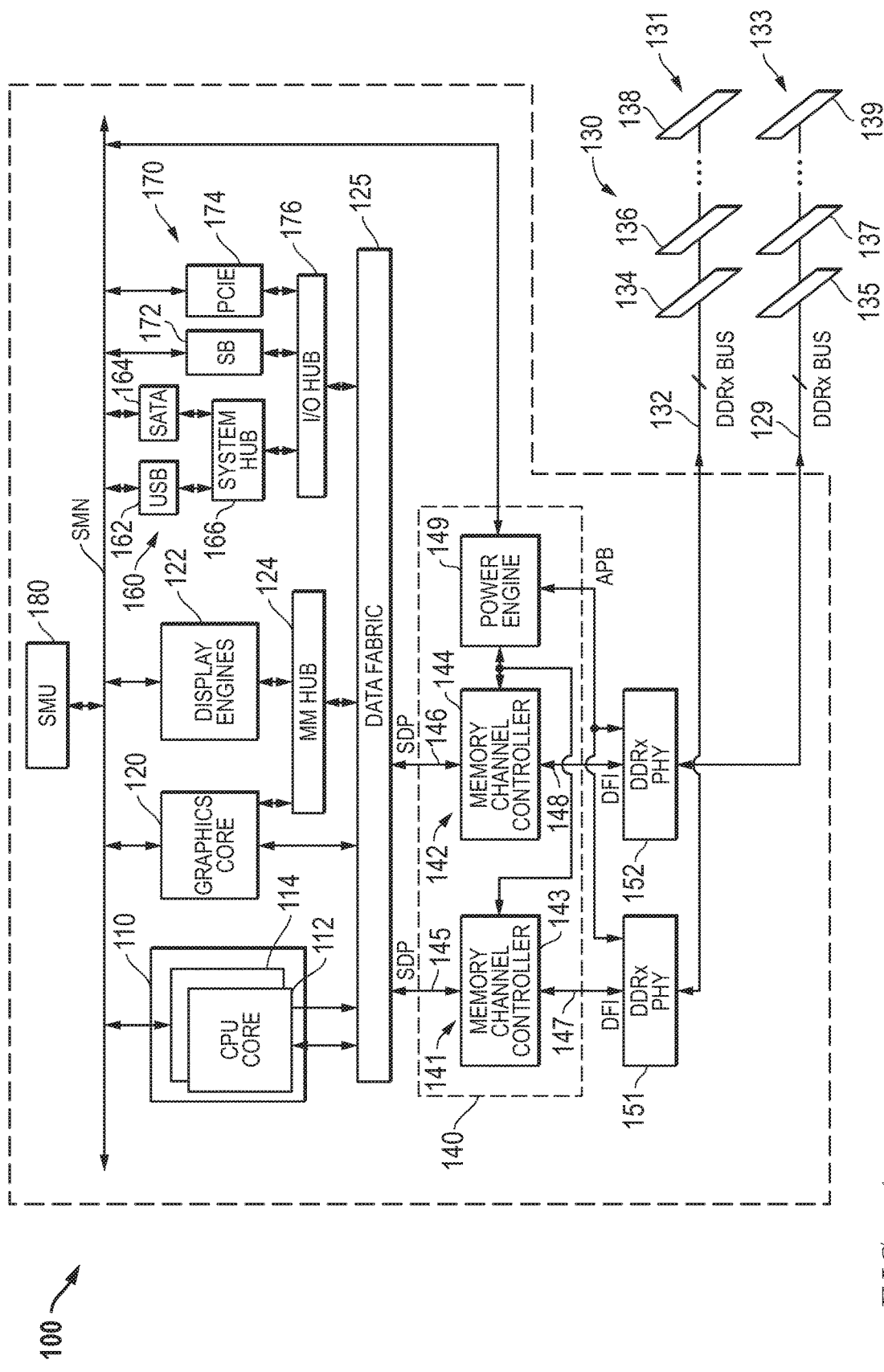
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a command queue having a first input for receiving memory access requests, and a memory interface queue having an output for coupling to a memory channel adapted for connecting to at least one dynamic random access memory (DRAM) module. An arbiter is connected to the command queue for selecting entries from the command queue, and placing them in the memory interface queue causing them to be transmitted over the memory channel. A refresh control circuit is connected to the arbiter and operable to monitor activate commands to be sent over the memory channel. In response to an activate command meeting a designated condition, a candidate aggressor row is identified associated with the activate command. A command is transmitted to the DRAM requesting that the candidate aggressor row be queued for mitigation in a future refresh or refresh management event.

A data processing system includes a data processor, a data fabric connected to the data processor, and a memory controller connected to the data fabric for fulfilling memory requests from the data processor. The memory controller includes a command queue having a first input for receiving memory access requests, and a memory interface queue having an output for coupling to a memory channel adapted for connecting to at least one dynamic random access memory (DRAM) module. An arbiter is connected to the command queue for selecting entries from the command queue, and placing them in the memory interface queue causing them to be transmitted over the memory channel. A refresh control circuit is connected to the arbiter and operable to monitor activate commands to be sent over the memory channel. In response to an activate command meeting a designated condition, a candidate aggressor row is identified associated with the activate command. A command is transmitted to the DRAM requesting that the candidate aggressor row be queued for mitigation in a future refresh or refresh management event.

A method includes receiving a plurality of memory access requests including memory reads and memory writes. Memory access commands for fulfilling the memory access requests are selectively placed in a memory interface queue and transmitting the memory access commands from the memory interface queue to a memory channel coupled to at least one dynamic random access memory (DRAM). Activate commands to be sent over the memory channel are monitored. In response to an activate command meeting a designated condition, a candidate aggressor row is identified associated with the activate command. A command is transmitted to the DRAM requesting that the candidate aggressor row be queued for mitigation in a future refresh or refresh management event.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
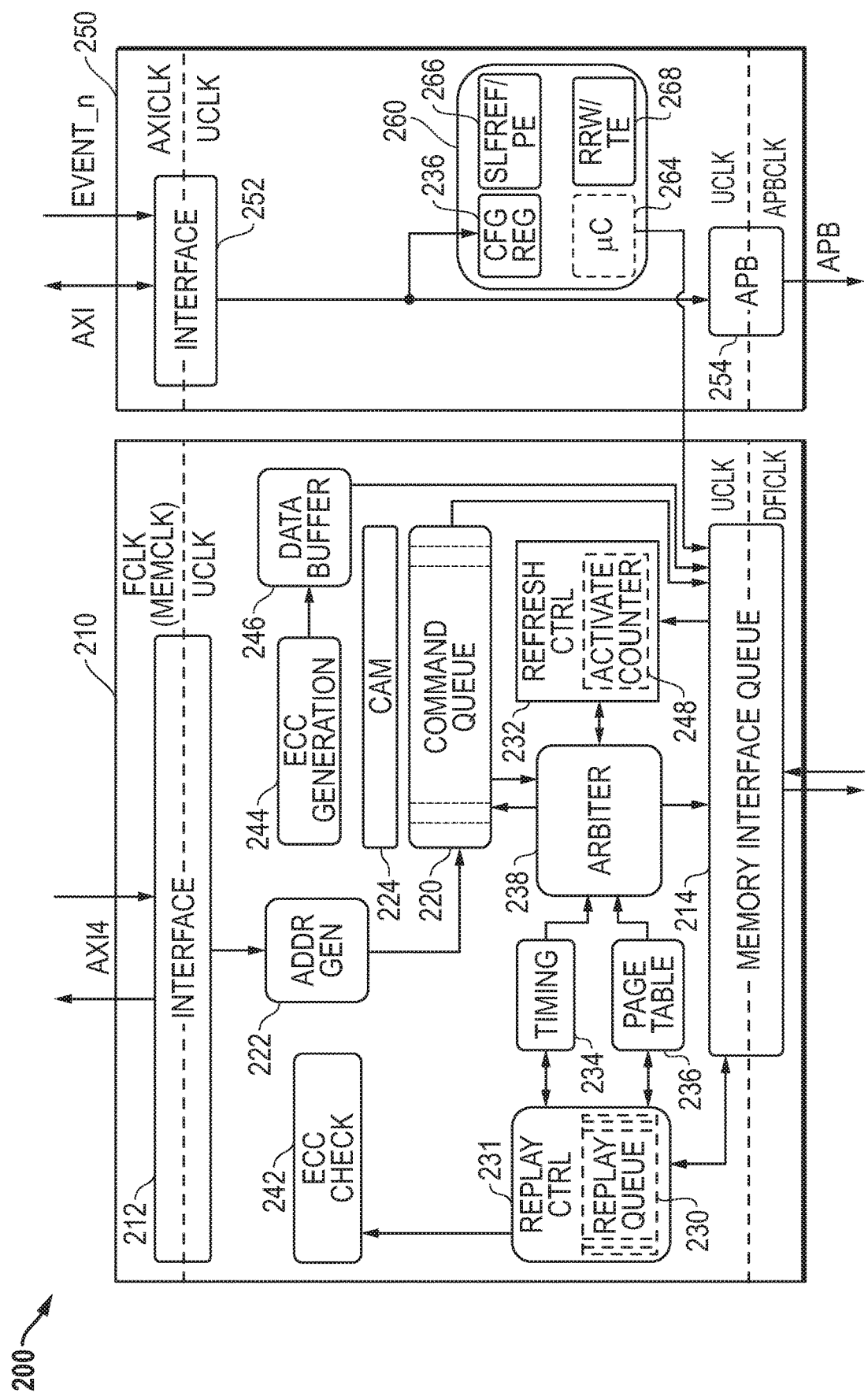
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh control circuit block 232, a timing block 234, a page table 236, an arbiter 238, an error correction code (ECC) check circuit 242, an ECC generation block 244, and a data buffer 246.

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the memory. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a replay sequence in which accesses are replayed in the case of a parity or ECC error of one of these cycles. Replayed commands are placed in the memory interface queue 214.

Refresh control circuit 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh control circuit 232 generates refresh commands periodically and in response to designated conditions to prevent data errors caused by leaking of charge off storage capacitors of memory cells in DRAM chips. Refresh control circuit 232 includes an activate counter 248, which in this embodiment has a counter for each memory region which counts a rolling number of activate commands sent over the memory channel to a memory region. The memory regions are memory banks in some embodiments, and memory sub-banks in other embodiments as further discussed below. Refresh control circuit 232 also generates refresh commands, which include both refresh (REF) commands and refresh management (RFM) commands, in which the RFM commands direct the memory to perform refresh functions for mitigating row hammer issues as further described below. In addition, refresh control circuit 232 periodically calibrates ZQ to prevent mismatch in on-die termination resistance due to thermal changes in the system.

Arbiter 238 is bidirectionally connected to command queue 220 and is the heart of memory channel controller 210. It improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT_n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self refresh controller (SLFREF/PE) 266, and a reliable read/write timing engine (RRW/TE) 268. Configuration registers 262 are programmed over the AXI bus, and store configuration information to control the operation of various blocks in memory controller 200. Accordingly, configuration registers 262 have outputs connected to these blocks that are not shown in detail in FIG. 2. Self refresh controller 266 is an engine that allows the manual generation of refreshes in addition to the automatic generation of refreshes by refresh control circuit 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Figure 3:
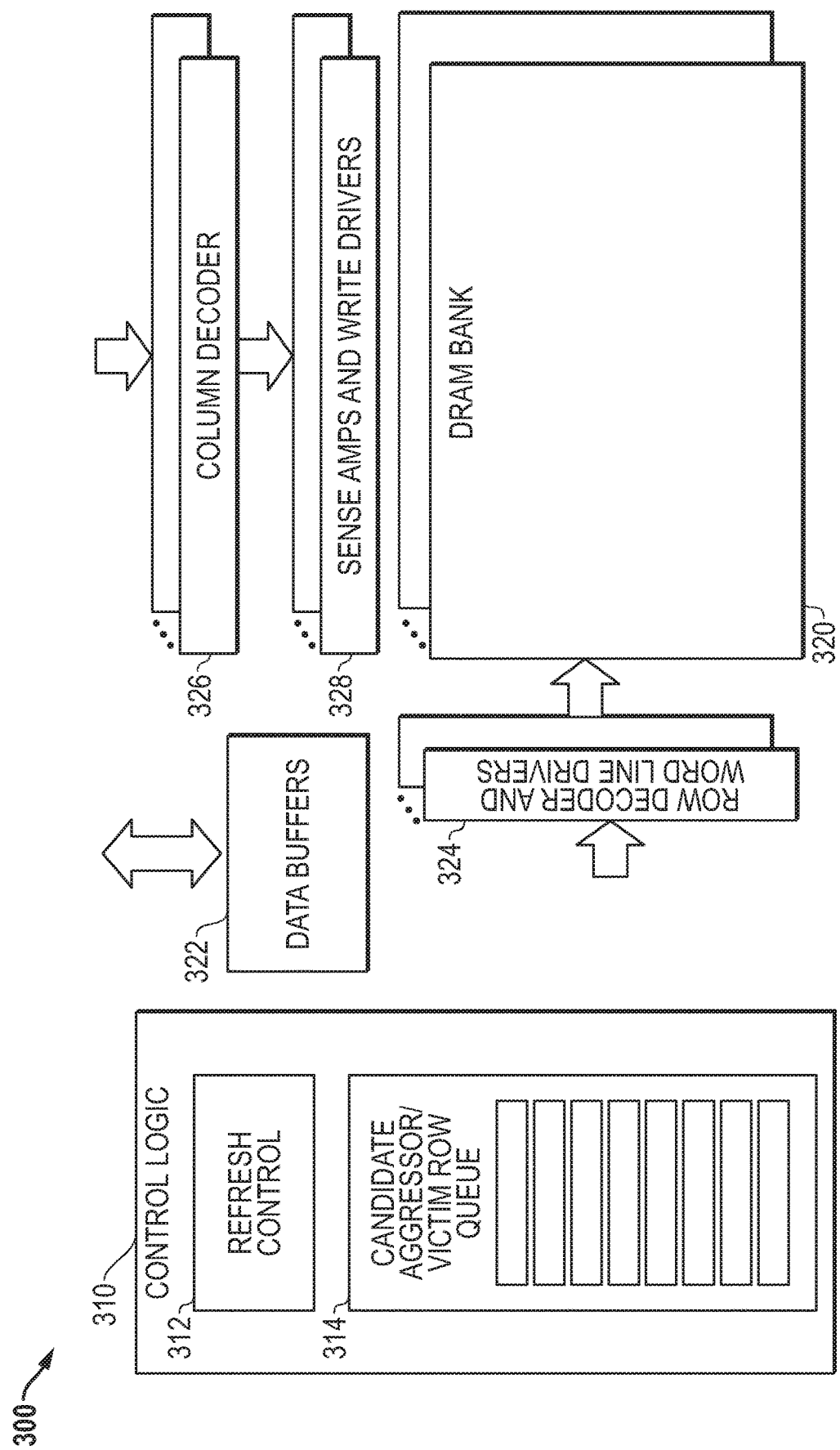
FIG. 3 illustrates in block diagram form a memory device according to some embodiments.

FIG. 3 illustrates in block diagram form a memory 300 according to some embodiments. Memory 300 is configured to communicate with a memory controller such as memory controller 200 of FIG. 2. Memory 300 generally includes control logic 310 and a DRAM core including multiple DRAM banks 320, along with circuitry used to read and write data to and from the DRAM banks 320. A set of row decoders and word line drivers 324 are used to access the rows and control the gates of transfer lines. A set of column decoders 326 are used to select locations within the memory array, and a set of sense amps and write drivers 328 perform precharge operations on the memory locations, and read and write data to memory locations. Data buffers 322 hold incoming and outgoing data for write and read operations.

Control logic 310 includes refresh control logic 312 and a candidate aggressor/victim row queue 314, as well as various other control logic, not shown separately, such as command decode logic and a mode register. Refresh control logic 312 controls the charge refresh of rows within memory 300, including handling refresh (REF) commands and refresh management (RFM) commands. In addition, refresh control logic 312 maintains candidate aggressor/victim row queue 314 responsive to commands received from a memory controller identifying candidate aggressor rows.

In various embodiments, commands that cause an addition(s) to the candidate aggressor/victim row queue 314 are a precharge list (PREL) command, an activate list (ACTL) command, and a refresh management list (RFML) command. The command names may, of course, vary in different embodiments. The PREL and ACTL commands identify a candidate aggressor row to memory 300 by tagging an activate (ACT) command or precharge (PRE) command as pertaining to a row that is a candidate aggressor row. The RFML command identifies a candidate aggressor to memory 300 row by including the row address of the candidate aggressor row with the RFML command. For example, As further described below, these commands cause either the candidate aggressor row or one or more candidate victim rows associated with the candidate aggressor row to be added to candidate aggressor/victim row queue 314. Then, when a subsequent RFM command is received at memory 300, refresh control logic 312 causes refreshes to occur for one or more rows selected from candidate aggressor/victim row queue 314. In some embodiments, a subsequent REF command may also cause refresh control logic 312 to select candidate rows for refresh based on the rows listed in candidate aggressor/victim row queue 314.

In some embodiments, candidate aggressor/victim row queue 314 stores one or more victim rows associated with the candidate aggressor row. An example of such a process discussed with respect to FIG. 4. In other embodiments, candidate aggressor/victim row queue 314 stores the candidate aggressor row address directly. An example of such a process is discussed with respect to FIG. 5. In either case, refresh control logic 312 includes decode logic to identify which potential victim rows are adjacent to the candidate aggressor row. While a "queue" is described here, other embodiments may include a list of candidate aggressor rows from which refresh control logic 312 is able to select in any order when performing refresh operations. While in some embodiments, it is suitable for the memory controller to identify candidate victim rows, typically the memory controller does not have information needed to identify specific victim rows because the mapping between addresses and physical rows varies in particular DRAM designs. It is therefore typically more beneficial to identify candidate aggressor rows. Furthermore, while some embodiments record candidate victim rows in candidate aggressor/victim row queue 314, it is typically more efficient to record the candidate aggressor row because, for each candidate aggressor, memory 300 may have one victim row in each physical direction or more than one, based on process node.

Figure 4:
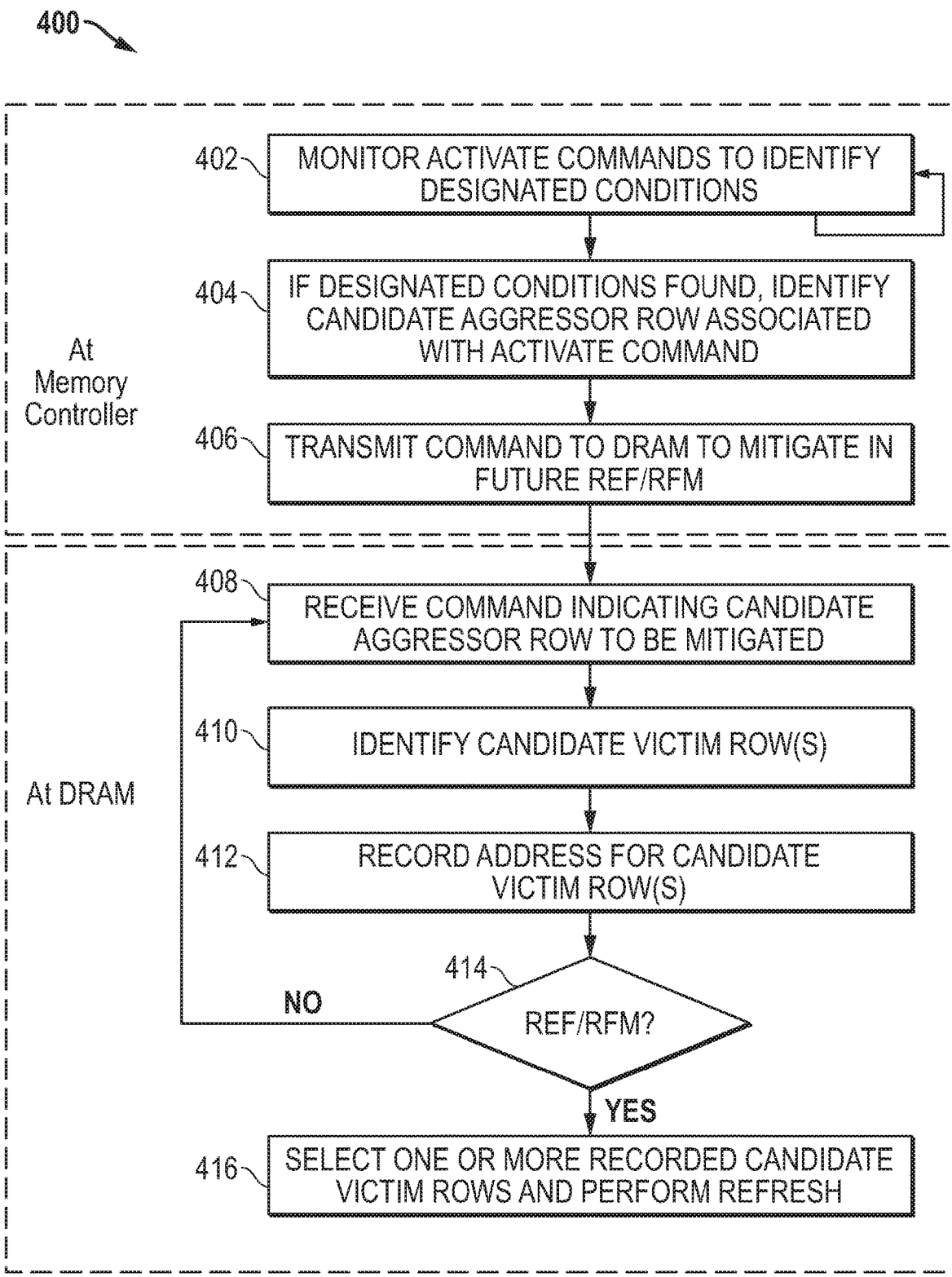
FIG. 4 is a flow chart of a process for refresh management according to some embodiments.

FIG. 4 is a flow chart of a process 400 for refresh management according to some embodiments. Process 400 includes blocks 402, 404, and 406 performed at a memory controller, for example by refresh control circuit 232 (FIG. 2). Blocks 408, 410, 412, 414, and 416 are performed at a DRAM memory, for example by refresh control logic 312 (FIG. 3).

Process 400 begins at block 402, which monitors activate commands to be sent over the memory channel during operation at the memory controller to identify certain designated conditions which are likely to result in row hammer problems in which too many ACT commands for an aggressor row cause bit errors in neighboring victim rows. The designated conditions may be identified in a number of suitable ways. For example, an activate counter for a certain memory region such as a bank or sub-bank may be above a certain threshold. Or, ACT commands may be tracked at a granularity finer than bank or sub-bank. For example, a monitoring process similar to that used for existing targeted row refresh (TRR) commands may be employed, in which conditions for potential victim rows are determined by counting the number of row activations for each row and comparing it against predefined chip-specific maximum activate count (MAC) and maximum activate window (tMAW) values. The MAC value is the maximum total number of row activations that may occur on a particular DRAM row within a time interval that is equal to or shorter than the tMAW amount of time. In another example, a designated condition for a potential row hammer problem may be if the sum of row activations for the two neighboring rows on either side of a particular row reaches the MAC limit within the tMAW time window.

When the designated conditions are identified at block 402, process 400 goes to block 404 where it identifies a candidate aggressor row associated with the activate command. While identifying a specific row as a candidate aggressor row is done in this embodiment, other embodiments identify the aggressor rows indirectly by identifying a candidate victim row which is adjacent to a candidate aggressor row. While a separate block is shown for identifying the candidate aggressor row, the actual identification of the candidate aggressor row may occur simultaneously with recognizing the occurrence of designated conditions at block 402.

Next at block 406, a command is transmitted from the memory controller to the DRAM memory requesting it to mitigate the row hammer problem for the identified candidate aggressor row when performing a future refresh or refresh management command. The particular command transmitted at block 406 varies in different embodiments, but in each case the row is somehow indicated to the DRAM to be a candidate aggressor row. In some embodiments, the memory controller has ability to send one or more of a precharge list (PREL) command, an activate list (ACTL) command, and/or a refresh management list (RFML) command. Other similar commands may accomplish the same function.

The ACTL command is a modified version of the ACT command which includes a tag on an ACT command for the row address of the candidate aggressor row indicating that it is a candidate aggressor row. Suitable tag schemes may be one or more selected bits in the command set to HIGH or LOW. Such a command is operable to cause the DRAM to activate the row and to queue the row as a candidate aggressor row. The PREL command is a modified version of a PRE command operable to cause the DRAM to precharge a row, and including a tag indicating that the row is a candidate aggressor row and should be queued as such. The RFML command is a new command which includes the address of the candidate aggressor row and indicates to the DRAM that it should be added to candidate aggressor/victim row queue 314.

At block 408, the transmitted command is received at the DRAM indicating to the DRAM that the identified row is a candidate aggressor row to be mitigated. For commands which also include an action such as precharge or activate, the action is performed by the DRAM control logic. In this embodiment, candidate victim rows are identified and recorded, while in the embodiment of FIG. 5, the candidate aggressor row address is recorded and candidate victim rows are identified when a REF or RFM command is performed. At block 410, process 400 identifies one or more candidate victim rows associated with the identified candidate aggressor row. This identification typically includes using decode logic to identify row addresses that are adjacent to or near the candidate aggressor row in the particular row layout employed at the DRAM.

At block 412, the address of the identified candidate victim row(s) is recorded at the DRAM for future mitigation. For example, in the embodiment of FIG. 3, the address is recorded in candidate aggressor/victim row queue 314. In contrast to prior refresh management schemes such as TRR, mitigation of the row hammer issue is not performed immediately at block 412. Instead, process 400 goes to block 414 where it waits until a REF or RFM command is received. Process 400 continues to receive commands at block 408 and record the victim rows until an REF or FRM command is received. When such a command is received, process 400 goes to block 416 where it selects one or more recorded candidate victim rows and conducts some mitigation operation such as a refresh operation for the rows.

Figure 5:
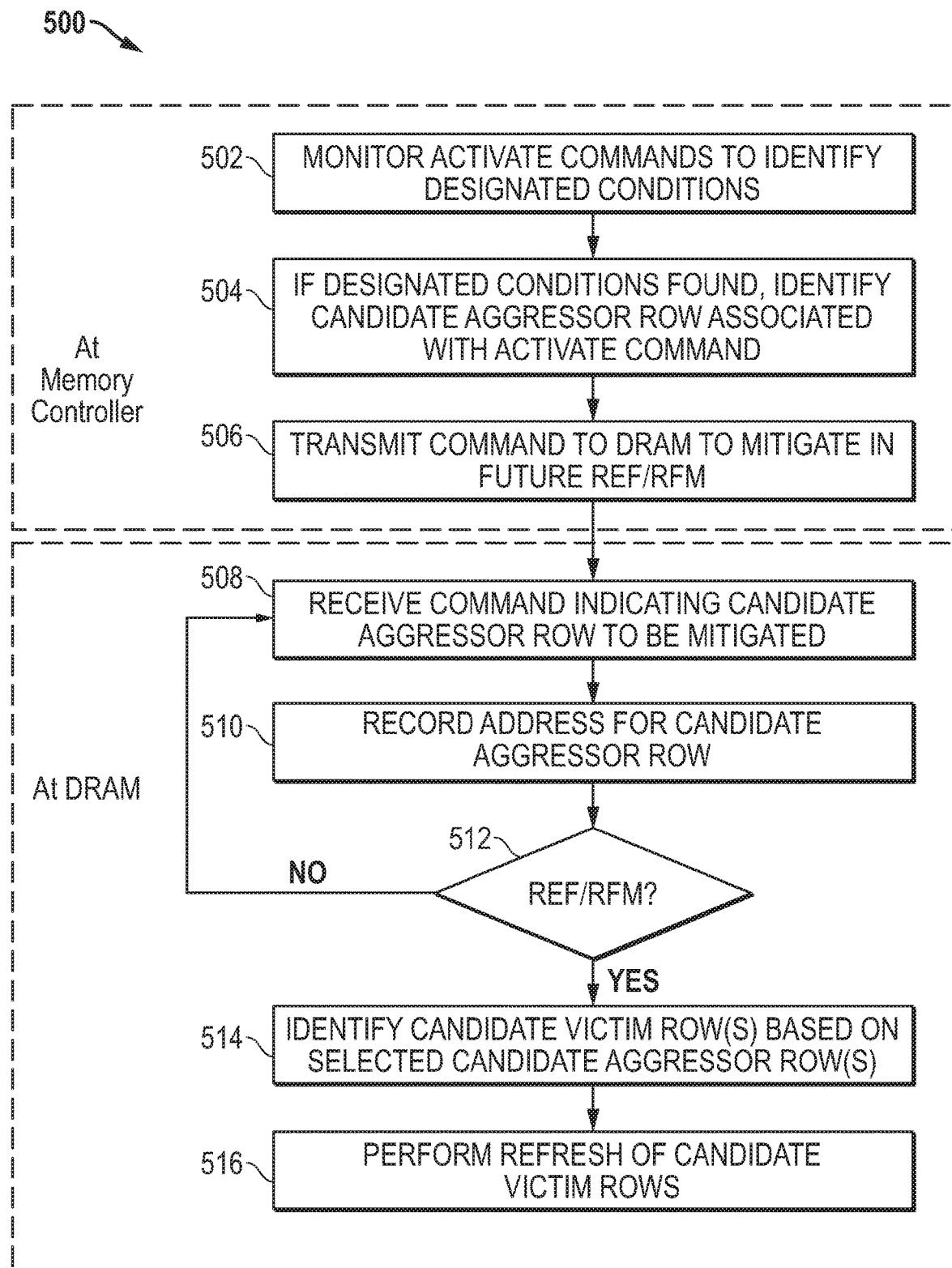
FIG. 5 is a flow chart of a process for refresh management according to some additional embodiments.
Figure 6:
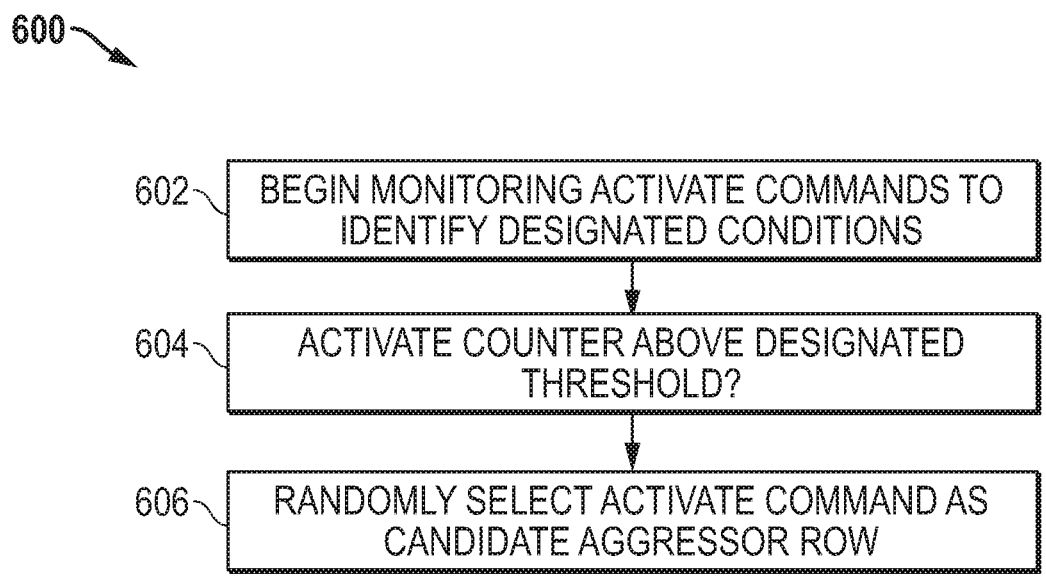
FIG. 6 is a flow chart illustrating a process for selecting candidate aggressor rows according to some embodiments.
Figure 7:
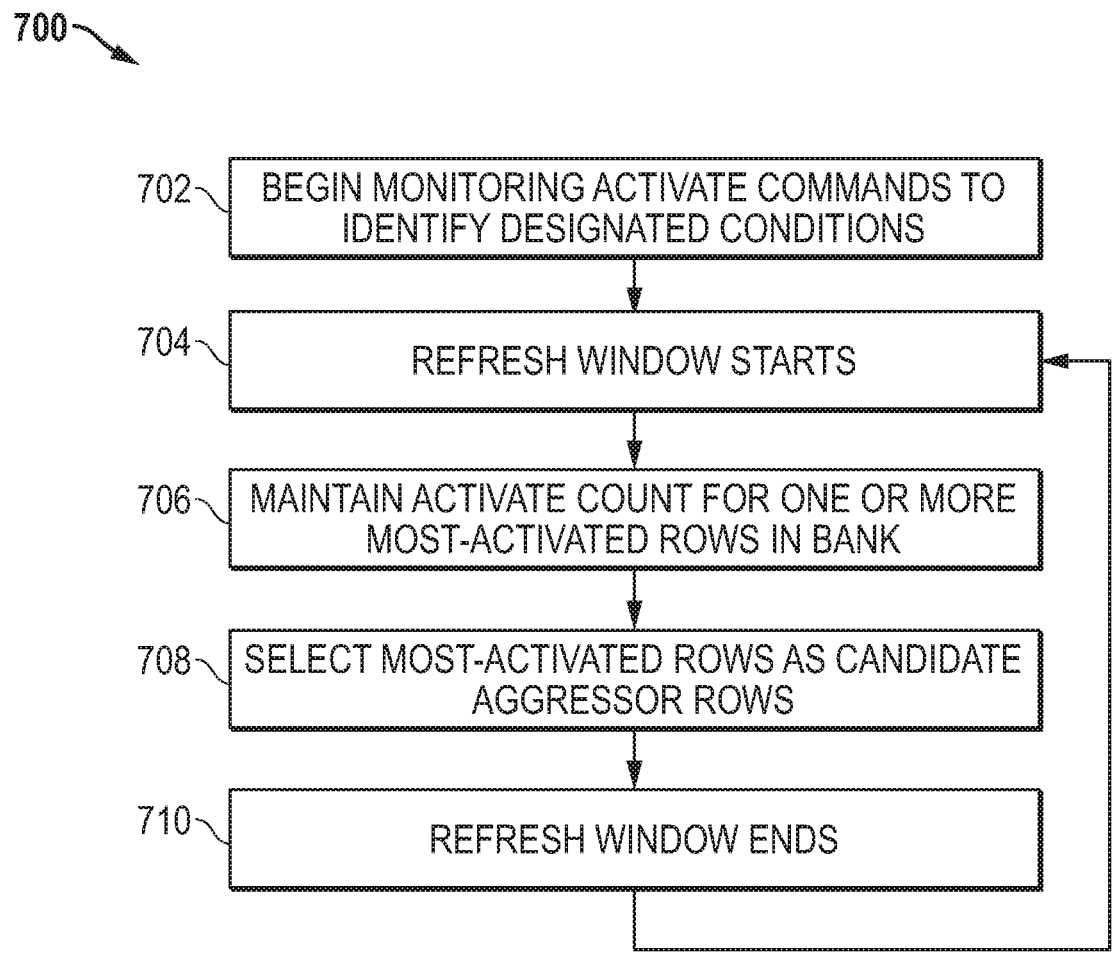
FIG. 7 is a flow chart illustrating a process for selecting candidate aggressor rows according to some additional embodiments.

FIGS. 5-7 illustrate various exemplary refresh management processes that identify candidate aggressor rows according to suitable alternative methods. While some embodiments may count row activate commands for all rows, FIG. 5 is a flow chart of a process 500 for refresh management according to some embodiments. Process 500 includes blocks 502, 504, and 506 performed at a memory controller, for example by refresh control circuit 232 (FIG. 2). Blocks 508, 510, 512, 514, and 516 are performed at a DRAM memory, for example by refresh control logic 312 (FIG. 3). Process 500 is similar to process 400 of FIG. 4, but rather than recording addresses of candidate victim rows, process 500 records addresses of the candidate aggressor rows, and identifies the candidate victim rows at the time refresh operations are performed for the candidate victim rows.

Process 500 begins at block 502 which monitors activate commands to be sent over the memory channel during operation at the memory controller to identify certain designated conditions which are likely to result in row hammer problems. The designated conditions employed in various embodiments are discussed with respect to FIG. 4.

When designated conditions are identified at block 502, process 500 goes to block 504 where it identifies a candidate aggressor row associated with the activate command. While a separate block is shown for identifying the candidate aggressor row, the actual identification of the candidate aggressor row may occur simultaneously with recognizing the occurrence of designated conditions at block 502.

Next at block 506, a command is transmitted from the memory controller to the DRAM memory requesting it to mitigate the row hammer problem for the identified candidate aggressor row when performing a future refresh or refresh management command. The various commands suitable for use at this block are discussed with respect to block 406.

At block 508, the transmitted command is received at the DRAM indicating to the DRAM that the identified row is a candidate aggressor row to be mitigated. For commands which also include an action such as precharge or activate, the action is performed by the DRAM control logic. At block 510, the address of the identified candidate aggressor row is recorded at the DRAM for future mitigation.

As shown at block 512, until an REF or RFM command is received, process 500 returns to block 508 and continues to receive commands which may result in more candidate aggressor rows being identified and their addresses recorded. If a REF or RFM command is received at block 512, process 500 goes to block 514, where it selects one or more of the recorded candidate aggressor rows to be mitigated. Process 500 then identifies one or more candidate victim rows associated with the selected candidate aggressor row. This identification typically includes using decode logic to identify row addresses that are adjacent to or near the candidate aggressor row in the particular row layout employed at the DRAM. Then at block 516 process 500 performs mitigation for the identified candidate victim rows.

FIG. 6 is a flow chart illustrating a process 600 for selecting candidate aggressor rows according to some embodiments. Process 600 is performed at a memory controller by a refresh control circuit such as refresh control circuit 232 of FIG. 2. At block 602, process 600 begins monitoring activate commands to identify designated conditions that may result in a row hammer problem. As shown at block 604, in this embodiment the designated conditions include an activate counter for a memory region being above a designated threshold. When such conditions are identified at block 604, process 600 goes to block 606 where it randomly selects from among the rows receiving an ACT command to select a candidate aggressor row.

FIG. 7 is a flow chart illustrating a process 700 for selecting candidate aggressor rows according to some additional embodiments. At block 702, process 700 begins monitoring activate commands to identify designated conditions that may result in a row hammer problem. At block 704, a refresh windows starts during which activate commands are tracked. In this embodiment, activate commands are monitored over a refresh period defined by a row cycle time tREFC specifying the maximum period between row refreshes, which designated for each memory device. Other time periods related to the refresh timing are also suitable to define the refresh period. A separate refresh window may be measured for different memory banks.

At block 706, an activate count is maintained for one or more most-activated rows in the memory bank. A number of counters may be used in order to track multiple rows that are frequently activated. During the refresh window, one or more of the most-activated rows may be selected as candidate aggressor rows, as shown at block 708. In this embodiment, the selection is based on the activate count being above a designated threshold. When the refresh window ends at block 710, a new refresh window is started at block 704. The counters used to track the activate count are reset at start of a new refresh window.

While particular embodiments have been described, various modifications to these embodiments will be apparent to those skilled in the art. For example, the internal architecture of memory controller 200 and memory 300 may vary in different embodiments. Memory controller 200 may interface to other types of memory besides DDRx, such as high bandwidth memory (HBM), and the like. While the illustrated embodiment showed each rank of memory corresponding to separate DIMMs or SIMMs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:

1. A memory controller, comprising:
a command queue having a first input for receiving memory access requests;
a memory interface queue having an output for coupling to a memory channel adapted for coupling to a dynamic random access memory (DRAM);
an arbiter coupled to the command queue for selecting entries from the command queue, and placing them in the memory interface queue causing them to be transmitted over the memory channel; and
a refresh control circuit coupled to the arbiter and operable to:
monitor activate commands to be sent over the memory channel;
in response to an activate command meeting a designated condition, identify a candidate aggressor row associated with the activate command; and
transmit a command to the DRAM identifying the candidate aggressor row and requesting that the candidate aggressor row be queued for mitigation in a future refresh or refresh management event, wherein transmitting the command to the DRAM includes tagging an activate command that includes a row address of the candidate aggressor row.

2. The memory controller of claim 1, wherein the activate command is an activate list command operable to cause the DRAM to activate a row and to record the row as a candidate aggressor row.

3. The memory controller of claim 1, wherein the refresh control circuit is further operable, in response to identifying the candidate aggressor row, to cause a record of the candidate aggressor row to be stored in a list of candidate aggressor rows.

4. A data processing system, comprising:
a data processor;
a data fabric coupled to the data processor; and
a memory controller coupled to the data fabric for fulfilling memory requests from the data processor, the memory controller comprising:
an output for coupling to a memory channel adapted for coupling to at least one dynamic random access memory (DRAM); and
a refresh control circuit, wherein the refresh control circuit is operable to:
monitor activate commands to be sent over the memory channel;
in response to an activate command meeting a designated condition, identify a candidate aggressor row associated with the activate command; and
transmit a command to the DRAM identifying the candidate aggressor row and requesting that the candidate aggressor row be queued for mitigation in a future refresh or refresh management event, wherein transmitting the command to the DRAM includes tagging a precharge command including a row address of the candidate aggressor row.

5. The data processing system of claim 4, wherein the precharge command is a precharge list command operable to cause the DRAM to precharge a row and to tag the row as the candidate aggressor row.

6. The data processing system of claim 4, wherein the refresh control circuit is further operable, in response to the candidate aggressor row being indicated to the DRAM, to cause a record of the candidate aggressor row to be stored in a list of candidate aggressor rows.

7. The data processing system of claim 4, wherein transmitting the command to the DRAM causes the DRAM to store a record of one or more victim rows associated with the candidate aggressor row for refresh management during one of a subsequent refresh management command and a subsequent refresh command.

8. The data processing system of claim 7 wherein the DRAM incudes an internal refresh management circuit which determines one or more victim rows associated with the candidate aggressor row.

9. The data processing system of claim 4, wherein the DRAM includes an internal refresh management circuit which responds to a refresh management command by causing a plurality of victim rows each associated with one or more corresponding candidate aggressor rows to be refreshed.

10. A method, comprising:
receiving a plurality of memory access requests including memory reads and memory writes;
selectively placing memory access commands for fulfilling the memory access requests in a memory interface queue and transmitting the memory access commands from the memory interface queue to a memory channel coupled to at least one dynamic random access memory (DRAM);
monitoring activate commands to be sent over the memory channel;
in response to an activate command meeting a designated condition, identifying a candidate aggressor row associated with the activate command; and
transmitting a command to the DRAM identifying the candidate aggressor row and requesting that the candidate aggressor row be queued for mitigation in a future refresh or refresh management event, wherein transmitting the command to the DRAM includes tagging an activate command that includes a row address of the candidate aggressor row.

11. The method of claim 10, wherein the activate command is an activate list command operable to cause the DRAM to activate a row and to record the row as a candidate aggressor row.

12. The method of claim 10, further comprising, in response to the candidate aggressor row being indicated to the DRAM, causing a record of the candidate aggressor row to be stored at the DRAM in a list of candidate aggressor rows.

13. The method of claim 10, in response to the candidate aggressor row being identified to the DRAM, storing a record of one or more victim rows associated with the candidate aggressor row at the DRAM for refresh management during one of a subsequent refresh management command and a subsequent refresh command.

14. The method of claim 10, wherein the DRAM responds to a refresh management command by causing a plurality of victim rows each associated with one or more corresponding candidate aggressor rows to be refreshed.

* * * * *